United States Patent [19]

Dartois et al.

[11] Patent Number: 5,309,444
[45] Date of Patent: May 3, 1994

[54] INTEGRATED CIRCUIT INCLUDING A TEST CELL FOR EFFICIENTLY TESTING THE ACCURACY OF COMMUNICATION SIGNALS BETWEEN A STANDARD CELL AND AN APPLICATION CELL

[75] Inventors: Luc Dartois, Colombes; Jacques Dulongpont, Pontoise, both of France; Peter Reusens, Laarne, Belgium

[73] Assignee: Alcatel Radiotelephone, Paris, France

[21] Appl. No.: 739,544

[22] Filed: Aug. 2, 1991

[30] Foreign Application Priority Data

Aug. 3, 1990 [FR] France .................. 90 09978

[51] Int. Cl.$^5$ .................................. G06F 11/00
[52] U.S. Cl. ............................................ 371/10.2
[58] Field of Search ............... 371/10.2, 10.1, 8.1, 371/24, 21.2; 365/200; 324/73.1, 158 R

[56] References Cited

U.S. PATENT DOCUMENTS

| | | | |
|---|---|---|---|
| 4,698,588 | 10/1987 | Hwang et al. | 324/73 R |
| 4,819,234 | 4/1989 | Huber | 371/19 |
| 4,992,934 | 2/1991 | Portanova et al. | 364/200 |
| 5,212,693 | 5/1993 | Chao et al. | 371/10.2 |

FOREIGN PATENT DOCUMENTS 0358376 3/1990 European Pat. Off. ..... G01R 31/28

OTHER PUBLICATIONS

IBM Techical Disclosure Bulletin, vol. 25, No. 2, Jul. 1982, p. 709, New York, US; E. F. Hahn et al.: "VLSI testing by on-chip error detction".

Primary Examiner—Charles E. Atkinson
Assistant Examiner—Phung M. Chung
Attorney, Agent, or Firm—Sughrue, Mion, Zinn, Macpeak & Seas

[57] ABSTRACT

The present invention concerns an integrated circuit (1) comprising a standard cell (4), an application cell (2) and a test cell (3) designed in particular to store or to modify from outside the integrated circuit the value of communication signals passing between the standard cell and the application cell. The standard cell executing instructions provided on an instruction bus (3B4) by a program memory located in the application cell in response to an instruction address carried by an instruction address bus (3A4), the conductors of these buses constituting communication links. The integrated circuit further includes a branching circuit for replacing at least one erroneous instruction from the program memory with a replacement instruction previously stored in the integrated circuit in response to a predetermined state of the communication links.

8 Claims, 8 Drawing Sheets

INTEGRATED CIRCUIT INCLUDING A TEST CELL FOR EFFICIENTLY TESTING THE ACCURACY OF COMMUNICATION SIGNALS BETWEEN A STANDARD CELL AND AN APPLICATION CELL

BACKGROUND OF THE INVENTION

The present invention concerns an integrated circuit comprising a standard cell, an application cell and a test cell designed in particular to monitor communication signals between the previous two cells.

Modern electronic devices, and especially those which process digital signals, often comprise a programmable unit such as a microprocessor associated with a program memory and an application circuit combining peripheral circuits of the programmable unit and logic circuits specific to the functions that these devices implement. They are routinely mounted on an electronic circuit board on which the programmable unit and its memory are two standard components whereas the application circuit is usually an application-specific integrated circuit. The connections between these three components are therefore all visible on the circuit board and test or emulation equipment can therefore access them during the various test and debugging phases of the development of such devices.

Technological advances in the field of microelectronics now make it feasible to integrate in a single component the various devices that were previously mounted on a circuit board of this kind. The programmable unit is usually a standard cell defined by the manufacturer whereas the application circuit is specified by the component designer. The program memory is also usually a standard subsystem which in this disclosure will be arbitrarily combined with the application circuit to constitute what is referred to hereinafter as the "application cell". With this mode of implementation the only device connections accessible are the component leads which are reduced in number as compared to a printed circuit board implementation because most of the communication links between the standard cell and the application cell are not connected to pins. It is not desirable to increase significantly the number of pins as this increases the size and the cost of the component. It may even be ruled out by virtue of the technology employed. As a result, it is impossible to use known test and emulation methods on such components. The successive stages which previously consisted in debugging the application cell, developing the programming memory software, debugging this software and finally debugging the device as a whole can no longer be dissociated.

It is possible to use a computer-aided design tool to simulate the interaction between the standard cell and the application cell. In this way it is possible to verify mainly the operation of the communication links between the two cells. However, such simulations are time-consuming and costly given the computing power of the simulation tools. Component development and debugging times become incompatible with industrial constraints.

It is also possible to obtain from some manufacturers a component kit in which the programmable unit and the application cell are separate devices. During the test phase, the device is implemented as a mock-up in which the connections between the two components are accessible and so can be treated in a similar way to connections on electronic circuit boards. In this case the mock-up development cost is additional to the cost of the fully integrated component. Also, the performance of the mock-up device, and in particular its execution speed, are significantly degraded in comparison with what can be expected of the same device in its integrated version. It is therefore impossible to reproduce this version in all respects. The problem of limited speed is particularly accentuated if the programmable unit is a signal processor. The "boundary scan" test and emulation technique described in particular in IEEE (Institute of Electrical and Electronic Engineers) standard 1149.1 is used in the case of a fully integrated component. In this technique, a test cell is disposed between the standard cell and the application cell. It comprises, for each communication link, a scanning unit provided with a unit memory, these unit memories being interconnected to form a shift register connected to pins of the component. It is therefore possible, by adding a limited number of input/output pins, to record and to modify the communication signals carried by the communication links. This technique makes is possible to debug the application cell. It has the drawback of disrupting the communication links during movement of the information stored in the shift register because of the connections between these components.

When the test and emulation procedure is carried out, it is necessary to be able to command the test cell in response to a particular state of the various input/output signals of the standard cell.

The American company MOTOROLA has drawn up for the DSP 96000 signal processor an emulation technique it calls "on-chip emulation". In this technique the signal processor is a standard cell to which is added a serial interface enabling execution to be resumed after a break point and loading of an instruction by means of a set of registers and address comparators connected to the buses of the cell adapted to produce break points. The status of these buses can be read via the serial interface. This solution does not cover the case of a circuit comprising also an application cell, but only the cases where the standard cell is an "open" processor, meaning a processor whose instruction bus is accessible, or where the program memory is a RAM type rewritable memory. It does not make it possible to read the information present on the buses independently of the operation of the standard cell.

Patent application EP-0 358 376 discloses a test cell comprising a shift register in which stored information can circulate without disrupting the communication links. This test cell can also be commanded in response to the status of the standard cell input/output signals.

However, when the integrated circuit has been fabricated by the manufacturer, an error may remain in the program memory, which is often a read only memory (ROM). Any such error in the memory cannot be corrected. To alleviate this drawback, some manufacturers add to the circuit an additional rewritable memory such as an EPROM or EEPROM, for example. This additional memory uses specific technology which can limit the performance of the circuit in terms of processing speed and which is not necessarily compatible with the technology of the remainder of the circuit.

SUMMARY OF THE INVENTION

An object of the present invention is to provide an integrated circuit comprising a standard cell, an application cell and a test cell in which it is possible to correct an error in the program memory without degrading performance using a technique which is compatible with the manufacture of the circuit.

The objective of the invention is therefore to disclose the means to be added to an integrated circuit comprising a standard cell and an application cell to enable testing and emulation under the same conditions as if the circuit were in the form of discrete components assembled on a printed circuit board.

The integrated circuit in accordance with the invention comprises a standard cell, an application cell and a test cell designed in particular to store or to modify from outside the integrated circuit the value of communication signals passing between said standard cell and said application cell, said standard cell executing instructions provided on an instruction bus by a program memory located in said application cell in response to an instruction address carried by an instruction address bus, the conductors of said buses constituting communication links, characterized in that said test cell comprises branching means for replacing at least one erroneous instruction from said program memory with a replacement instruction previously stored in said integrated circuit in response to a predetermined state of at least some of said communication links.

In the integrated circuit comprising a standard cell, an application cell and a test cell the test cell comprising for each of said communication links a scanning unit provided with a unit memory connected at at least some times to said links, the unit memories being interconnected to form a first shift register, said test cell comprising also a second shift register provided with at least a first control register the outputs of which are each connected to a conductor of a first control bus, the integrated circuit advantageously comprises a comparator module to which are respectively connected the control bus and at least some of the communication links to produce a coincidence signal if the signals respectively supplied to it are identical.

Also, the integrated circuit comprising a standard cell, an application cell and a test cell, the standard cell operating in response to an operating mode signal, the latter comprises a trap circuit producing a trap signal for a predetermined state of the operating mode signal if the coincidence signal is present.

In a first embodiment of the integrated circuit comprising a standard cell, an application cell and a test cell the branching means comprises a substitution memory the last instruction that can be executed in which is an instruction to return to the program memory and a trap multiplexer the output of which is connected in place of the instruction bus in the standard cell, a first input of which selected by the trap signal receives an instruction to branch to the substitution memory and the second input of which selected in the absence of the trap signal is connected to the instruction bus.

In a first variant of the integrated circuit comprising a standard cell, an application cell and a test cell the substitution memory is accessed by the instruction address bus by means of a decoder circuit, writing and reading being effected by means of the scanning units of the first shift register associated with the instruction bus.

In a second variant of the integrated circuit comprising a standard cell, an application cell and a test cell the substitution memory is accessed directly by the standard cell, writing and reading being commanded by two further states of the operating mode signal.

In a second embodiment of the integrated circuit comprising a standard cell, an application cell and a test cell the scanning units associated with the instruction bus whose communication links each comprise an input channel and an output channel each comprise a first multiplexer the first input of which is connected to the input channel, the output of which is connected to the output channel and the control input of which receives the trap signal, a second multiplexer the second input of which is connected to the input channel and the output of which is connected to the input of a unit memory having its output connected to the second input of the first multiplexer, the first shift register comprising the succession of unit memories each connected to the first input of the second multiplexer of the next scanning unit, the output signals of the unit memories previously loaded by means of the first shift register forming the replacement instruction and then replacing the erroneous instruction following the appearance of the trap signal.

Also, in the integrated circuit comprising a standard cell, an application cell and a test cell the scanning unit further comprises a memory circuit whose data input is connected to the output of said unit memory and whose synchronization input receives a trigger signal, the second input of said first multiplexer being connected not to the output of the unit memory but rather to the output of the memory circuit.

BRIEF DESCRIPTION OF THE DRAWINGS

The various objects and features of the invention will emerge more clearly from the following description of embodiments of the invention given by way of non-limiting example and with reference to the appended diagrammatic drawings in which.

Components present in more than one figure are always identified by the same reference symbol.

DESCRIPTION OF THE PREFERRED EMBODIMENTS

Before describing the invention itself, the design of the various known parts of the integrated circuit will be outlined as this is essential to a proper understanding of the invention.

Figure 1:
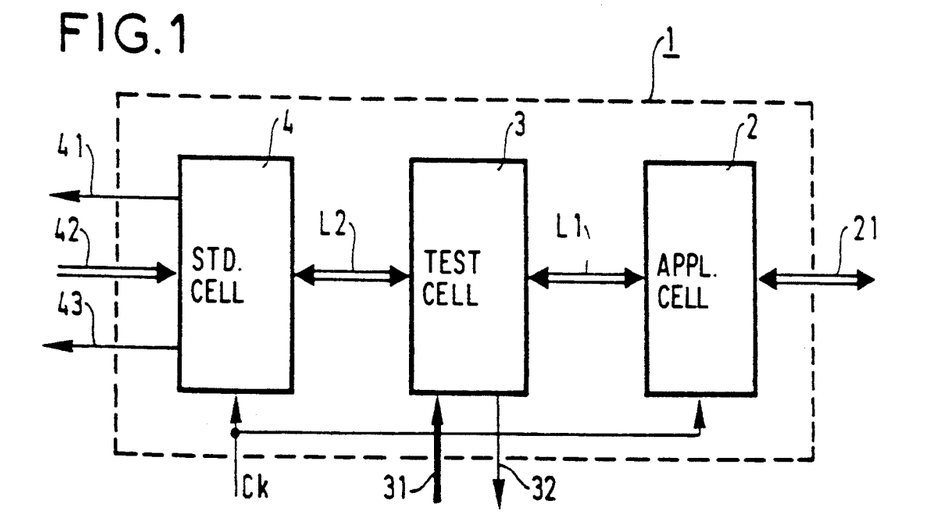
FIG. 1 is a block diagram of the integrated circuit in accordance with the invention.

The integrated circuit 1 shown schematically in FIG. 1 essentially comprises an application cell 2 a test cell 3 and a standard cell 4, in particular a programmable unit such as a microprocessor, a signal processor or a more sophisticated circuit usually referred to as a microcontroller. The test cell 3 is disposed between the other two cells to monitor the signals exchanged between them. The latter two cells receive the same clock signal Ck.

The application cell 2 is connected by a link 21 to the exterior of the component 1. This link represents all input and output connections between this cell and the device in which the component is incorporated. These inputs/outputs therefore represent input/output pins. This cell is also connected to the test cell 3 by a first communication link L1 which, apart from the invention, would be connected directly to the standard cell 4. This first communication link therefore represents all connections between the standard cell 4 and the application cell 2 to be monitored. It may comprise control buses or write, read, synchronization, interrupt, etc links.

The standard cell 4 is connected to the test cell 3 by a second communication link L2 which, apart from the invention, would be the same as the first communication link L1.

The test cell 3 receives command signals and modification information via a test link 31 and produces information on the status of the communication signals carried by the communication links on an observation link 32. In the normal operating mode of the integrated circuit 1 the test cell establishes the connection between these communication links and can store the communication signals without modifying them. It is as if it did not exist as far as the standard cell and the application cell are concerned. In the test or emulation operating mode of the integrated circuit the test cell can inject data received over the test link 31 into one or the other of the communication links L1, L2.

Figure 2:
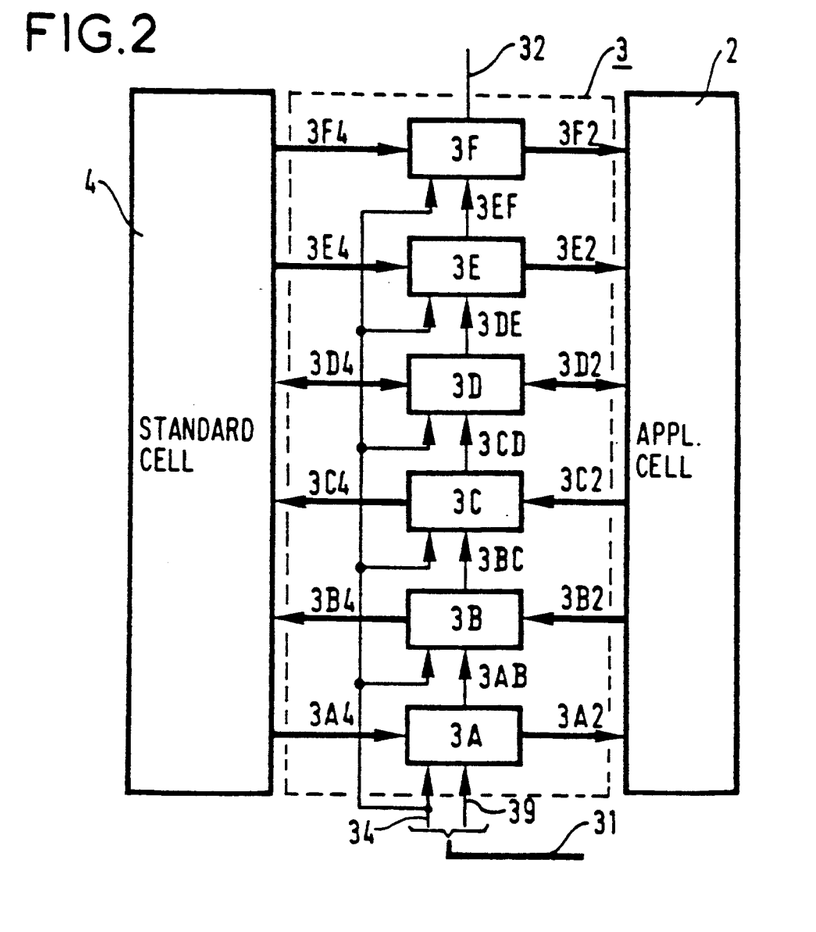
FIG. 2 is a block diagram of this circuit showing the test cell in more detail.

The test cell 3 will now be described in more detail with reference to FIG. 2. In this embodiment the program memory of the standard cell 4 is part of the application cell 2. It produces the instruction at the location identified by an instruction address.

The two communication links L1, L2 which carry the communication signals are made up of a number of communication buses.

Scanning modules connect a bus of the first communication link L1 to the corresponding bus of the second communication link L2. The various scanning modules and the various communication buses are listed in the following table.

|  | Scanning module | Link L1 | Link L2 |
| --- | --- | --- | --- |
| Instruction address bus | 3A | 3A2 | 3A4 |
| Instruction bus | 3B | 3B2 | 3B4 |
| Monitor input bus | 3C | 3C2 | 3C4 |
| Data bus | 3D | 3D2 | 3D4 |
| Monitor output bus | 3E | 3E2 | 3E4 |
| Data address bus | 3F | 3F2 | 3F4 |

All the buses are unidirectional except for the bidirectional data buses 3D2, 3D4.

The scanning modules comprise a unit memory for each conductor of the associated bus. These unit memories are arranged to form a shift register whose input receives a substitution signal 39 over the test link 31 and whose output is connected to the observation link 32.

The scanning modules further receive a synchronization signal 34 also carried by the test link 31.

The links 3AB, 3BC, 3CD, 3DE, 3EF between the various scanning modules which form the shift register are identified by three characters, the first being the digit 3, the second being the reference letter of the input side scanning module and the third being the reference letter of the output side scanning module.

On each pulse of the synchronization signal 34 all of the data stored in the shift register is advanced by one bit, a new input bit being provided by the substitution signal and the output bit being placed on the observation link 32.

The construction of the scanning module will be described in more detail later. Their functions will now be described.

The first scanning module 3A imposes an instruction address by injecting into the instruction address bus 3A2 of the first communication link L1 the data stored in its unit memories. It can also store in these memories the instruction address supplied by the standard cell 4 on the corresponding instruction address bus 3A4.

The second scanning module 3B imposes an instruction by injecting into the instruction bus 3B4 of the second communication link L2 the data stored in its unit memories. It can also store in these memories the instruction provided by the application cell 2 on the corresponding instruction bus 3B2.

The third scanning module 3C imposes a monitor signal by injecting into the monitor input bus 3C4 of the second communication link L2 the data stored in its unit memories. It can also store in these memories the monitor signals provided by the application cell 2 on the relevant monitor input bus 3C2. The monitor signals may be interrupts, indications, bus requests and reset requests, for example.

The fourth scanning module 3D associated with the bidirectional data buses 3D2, 3D4 imposes or stores data on each of these buses using its unit memories.

The fifth scanning module 3E imposes a monitor signal by injecting into the monitor output bus 3E2 of the first communication link L1 the data stored in its unit memories. It can also store in these memories monitor signals produced by the standard cell on the relevant monitor output bus 3E4. The monitor signals can be write signals, read signals, signals to activate other buses, etc.

The sixth scanning module 3F imposes a data address by injecting into the data address bus 3F2 of the first communication link L1 the information stored in its unit memories. It can also store in these memories the data address produced by the standard cell 4 on the relevant data address bus 3F4.

The six scanning modules are so designed that information can be routed in the shift register without modifying any of the signals present on the various buses, as will emerge more clearly as the description proceeds.

Figure 3:
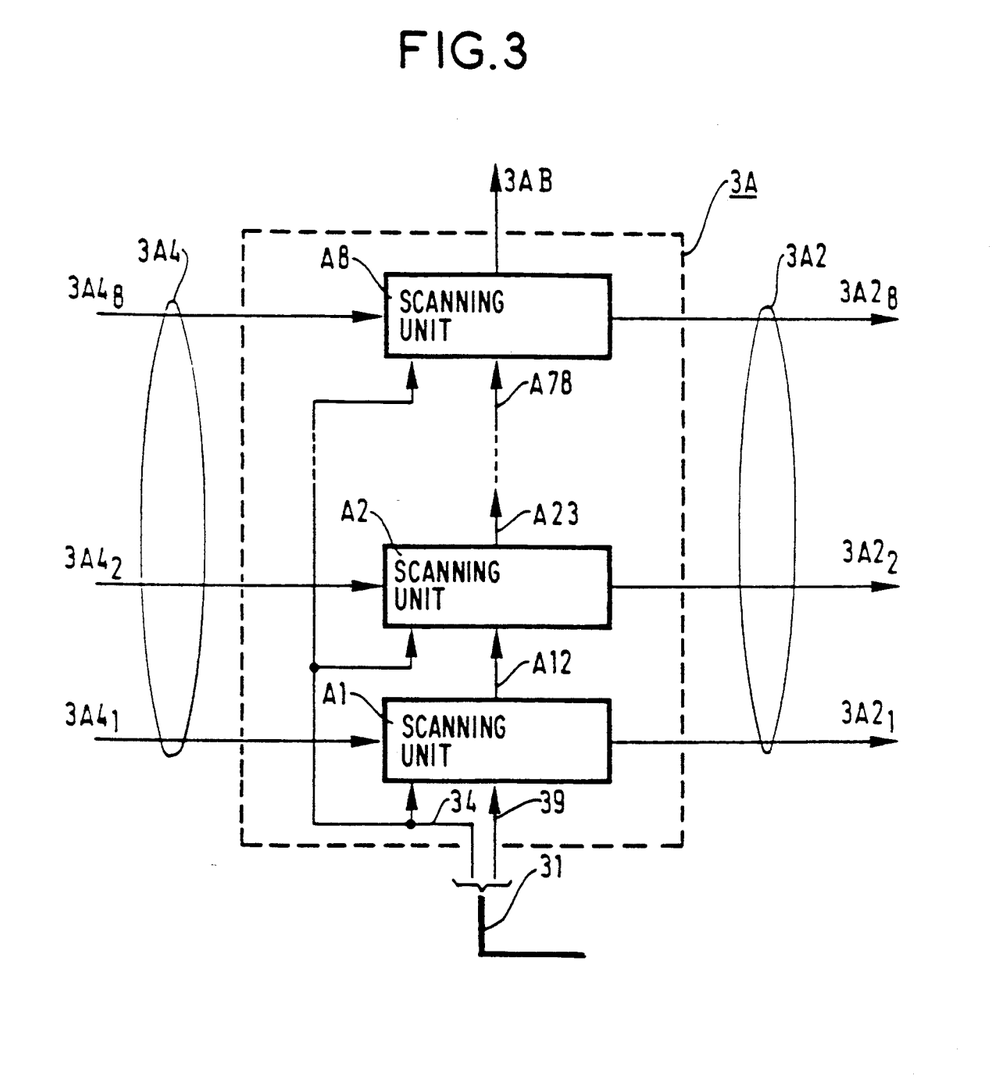
FIG. 3 is a block diagram of a scanning module of the test cell.

The first scanning module 3A will now be described in more detail with reference to FIG. 3. The two instruction address buses 3A2, 3A4 of the first and second communication links L1 and L2 each comprise eight conductors identified by the reference symbol of the bus of which they form part with a subscript between 1 and 8: $3A4_1$ through $3A4_8$ and $3A2_1$ through $3A2_8$. The scanning module 3A comprises one scanning unit for each pair of conductors with the same subscript. The eight scanning units are identified by a reference symbol comprising the letter A followed by a digit which is the same as the subscript of the conductors of the buses with which they are associated. Each scanning unit receives the synchronization signal 34. The first scanning unit A1 receives the substitution signal 39 and produces a first transfer signal A12 addressed to the second scanning unit. The second scanning unit A2 produces a second transfer signal A23 addressed to the third scanning unit, and so on up to the eighth scanning unit which receives a seventh transfer signal A78 and is connected to the second scanning module 3B by the first link 3AB.

Figure 4:
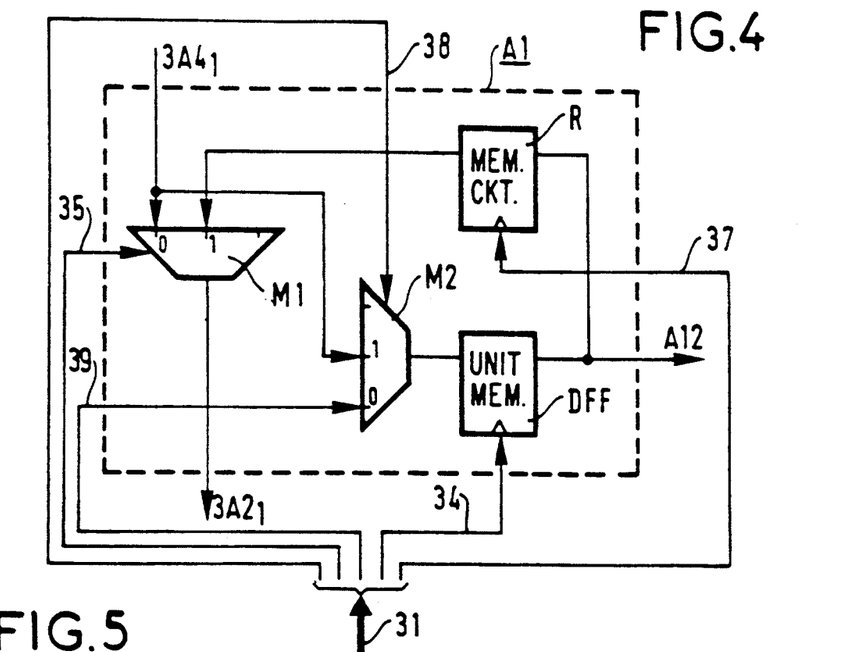
FIG. 4 shows a first embodiment of a scanning unit of a scanning module.

The first scanning unit A1 is shown in FIG. 4 in an embodiment which must not be regarded as limiting on the invention. It comprises a first multiplexer M1 whose 0 input is connected to an input channel of this unit which is the first conductor $3A4_1$ of the instruction address bus 3A4 of the second communication link L2, whose 1 input is connected to the output of a memory circuit R, whose control input receives a first selection signal 35 carried by the test link 31, and whose output is connected to the first conductor $3A2_1$ of the instruction address bus 3A2 of the first communication link L1 which is the output channel of the unit. It comprises a second multiplexer M2 whose 0 input receives the substitution signal 39, whose 1 input is connected to the 0 input of the first multiplexer M1, whose control input receives a second selection signal 38 and whose output is connected to the input of a unit memory DFF. This unit memory is a D type flip-flop, for example. It produces an output signal which takes the value that the signal applied to its data input had at the time of the previous rising edge applied to its synchronization input. Its synchronization input receives the synchronization signal 34 and its output produces the first transfer signal A12. The scanning unit further comprises a memory circuit R in the form of a latch, for example. It transmits the data input state directly to its output during the time interval in which its synchronization input is low. During the time interval in which this synchronization input is high, it transmits to its output the value that the signal applied to its data input had at the time of the previous rising edge applied to its synchronization input. It receives the first transfer signal A12 on its data input, a trigger signal 37 carried by the test link 31 on its synchronization input and its output is connected to the 1 input of the first multiplexer M1, as already described.

The trigger signal 37 reproduces the output state of the unit memory DFF at the output of the memory circuit R.

Depending on the values of the two selection signals 35, 38, the following operations are carried out:

the first and second multiplexers M1 and M2 are switched to their 0 inputs, the unit memory DFF which is the first element of the shift register, as will emerge later, can transmit the substitution signal 39 to its output in response to the synchronization signal 34, the first conductors $3A4_1$ and $3A2_1$ are connected together and isolated from the remainder of the scanning unit, so that the shift register can be advanced without modifying the operation of the standard cell 4 or the application cell 2, the first and second multiplexers M1 and M2 are respectively switched to their 0 and 1 inputs, the unit memory DFF can store the signal present on the first conductor $3A4_1$ of the instruction address bus 3A4 of the second communication link L2 in response to the synchronization signal 34, the first conductors $3A4_1$, $3A2_1$ being connected together as in the previous situation, so that storage occurs without disruption, the first and second multiplexers M1 and M2 are respectively switched to their 1 and 0 inputs, the first conductor $3A2_1$ of the instruction address bus 3A2 of the second communication link is connected to the output of the memory circuit R and, as in the previous situation, the unit memory DFF can transmit the substitution signal to its output in response to the synchronization signal 34, the first and second multiplexers M1 and M2 are switched to their 1 input, the first conductor $3A2_1$ of the instruction address bus 3A2 of the first communication link L1 is connected to the output of the memory circuit R and the unit memory DFF can store the signal present on the first conductor $3A4_1$ of the instruction address bus 3A4 of the second communication link L2.

Note that only this last situation justifies the presence of the memory circuit R in that it is necessary to store two items of information. In the other four situations only one item of information is required to be stored and the unit memory is therefore sufficient. The invention is therefore equally applicable to the situation in which this memory circuit is dispensed with, the 1 input of the first multiplexer M1 being then connected directly to the output of the unit memory DFF.

The second scanning unit is identical to the first, except as follows:

the 0 input and the output of its first multiplexer are respectively connected to the second conductors $3A4_2$, $3A2_2$ of the instruction address buses 3A4, 3A2 of the second and first communication links L2 and L1, the 0 input of its second multiplexer receives the first transfer signal A12, its unit memory produces by way of output signal the second transfer signal A23.

One skilled in the art will be readily able to transpose the foregoing modifications to define the inputs/outputs of the subsequent scanning units. Thus the nth scanning unit differs from the first only in the following respects:

the 0 input and the output of its first multiplexer are respectively connected to the nth conductors $3A4_n$, $3A2_n$ of the instruction address buses 3A4, 3A2, the 0 input of its second multiplexer receives the $(n-1)$th transfer signal $A(n-1)(n)$, its unit memory produces by way of output signal the nth transfer signal $A(n)(n+1)$, except for the eighth scanning unit for which the output signal is injected into the first link 3AB.

The second scanning module 3B is identical to the first scanning module 3A except that the instruction address buses 3A4, 3A2 of the second and first communication links L2 and L1 are respectively replaced with the instruction buses 3B2, 3B4 of the first and second communication links L1 and L2, the substitution signal 39 is replaced by the signal present on the first link 3AB and the first link is replaced by the second link 3BC.

One skilled in the art will be able readily to transpose these modifications to obtain a full definition of the subsequent scanning modules, except that the third scanning module 3D is connected to bidirectional buses.

The sixth scanning module 3F is different in the sense that it is connected to the observation link 32 rather than a circulation link.

It will be assumed initially that the data buses 3D2, 3D4 are unidirectional, with the result that the fourth scanning module 3D is rendered identical to all the others. In this case, the shift register is obtained by connecting in series all the unit memories of the test cell 3 along a circulation path by means of transfer signals flowing within the same scanning unit and by means of circulation links to interconnect these units, when the second selection signal 38 switches the second multiplexer of each scanning unit to its 0 input. In this case the circulation path is electrically isolated from each bus conductor of the two communication links L1, L2. The shift register is commanded by the synchronization signal 34.

The special case of the fourth scanning module 3D will now be discussed. This module is connected to two bidirectional data buses 3D2, 3D4 of the first and second communication links L1 and L2 which each comprise 16 conductors, eight input conductors identified by the same reference signal as the buses of which they form part followed by an I and a subscript between 1 and 8: $3D2I_1$ through $3D2I_8$ and $3D4I_1$ through $3D4I_8$, and eight output conductors identified by the reference symbol of the bus of which they form part followed by an O and a subscript between 1 and 8: $3D2O_1$ through $3D2O_8$ and $3D4O_1$ through $3D4O_8$. The scanning module comprises a scanning unit for each set of four conductors having the same subscript.

Figure 5:
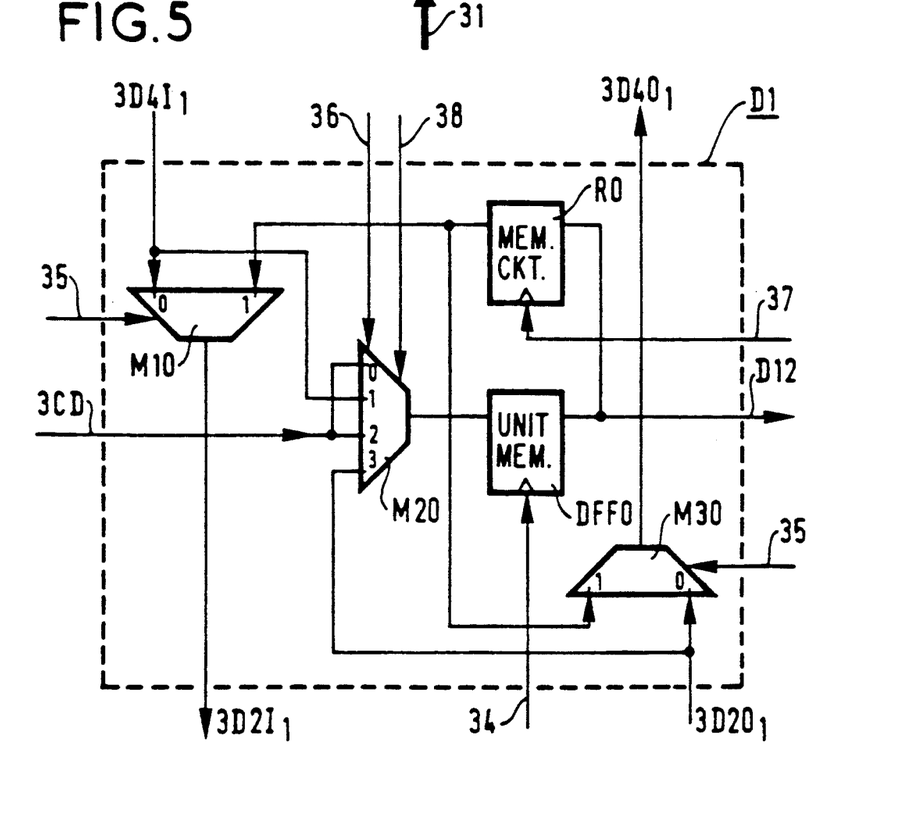
FIG. 5 shows a second embodiment of a scanning unit of a scanning module.

The first scanning unit D1 associated with the conductors having the subscript 1 shown in FIG. 5 comprises a first multiplexer M10 whose 0 input is connected to a first input channel of the unit which is the first input conductor $3D4i_1$ of the data bus 3D4 of the second communication link L2, the 1 input of which is connected to the output of the memory circuit R0 identical to that described previously, the control input of which receives the first selection signal 35 and the output of which is connected to the first input conductor $3D2i_1$ of the data bus 3D2 of the first communication link L1 which is a second output channel of this unit. It comprises a second multiplexer M20 whose 0 and 2 inputs are connected to the third circulation link 3CD, whose 1 input is connected to the 0 input of the first multiplexer M10, whose 3 input is connected to a second input channel of this unit which is the first output conductor $3D2O_1$ of the data bus 3D2 of the first communication link L1, the two control inputs of which receive the second selection signal 38 and a third selection signal 36, and the output of which is connected to the input of a unit memory DFFO identical to that previously described. It further comprises a third multiplexer M30 whose 0 input is connected to the 3 input of the second multiplexer M20, whose 1 input is connected to the output of the memory circuit R0, whose control input receives the first selection signal 35 and whose output is connected to the first output conductor $3D4O_1$ of the data bus 3D4 of the second communication link L2 which is the first output channel of this unit.

The unit memory DFFO of the scanning cell D1 whose input is connected to the output of the second multiplexer and receives the synchronization signal 34 on its synchronization input and produces at its output a first transfer signal D12 addressed to the second scanning unit D2.

The memory circuit R0 of the first scanning cell D1 has its data input connected to the output of the unit memory DFF0, its synchronization input receives the trigger signal 37 and its output is connected to the 1 input of the first and third multiplexers M10 and M30.

The third selection signal 36 selects the input conductors or the output conductors by selecting either the group of inputs 0, 1 or the group of inputs 2, 3 of the second multiplexer M20. In the former case, the second selection signal 38 selects the 0 or 1 input in the same way as for the second multiplexers of the scanning module and in the latter case it selects the 2 or 3 input according to whether it respectively selects the 0 or 1 input for the second multiplexers of these other modules.

The third multiplexer M30 has a function which is in all respects symmetrical with regard to the output conductor as that of the first multiplexer M10 with regard to the input conductor. For this reason its operation does not need to be described in more detail.

The elements of a scanning unit of the fourth scanning module 3D which are added to the scanning unit of one of the other scanning modules having now been described, the operation will not be described in detail as it is identical to what has previously been described.

Also, the above remark concerning the memory circuit R0 applies here also. Without departing from the scope of the invention, this circuit can be dispensed with provided that the 1 inputs of the first and third multiplexers M10 and M30 are connected directly to the output of the unit memory DFFO.

The second scanning unit D2 of the fourth scanning module 3D is identical to the first scanning unit D1 except as follows:

the 0 input and the output of its first multiplexer are respectively connected to the second input conductor $3D4I_2$ of the data bus 3D4 of the second communication link L2 and to the second input conductor $3D2I_2$ of the data bus 3D2 of the first communication link L1, the 0 input and the output of its third multiplexer are respectively connected to the second output conductor $3D2O_2$ of the data bus 3D2 of the first communication link L1 and to the second output conductor $3D4O_2$ of the data bus 3D4 of the second communication link L2, the 0 and 2 inputs of its second multiplexer receive the first transfer signal D12, its unit memory produces by way of output signal a second transfer signal D23.

One skilled in the art will be able readily to transpose the foregoing modifications to define the inputs/outputs of the subsequent scanning units. Thus the nth scanning unit differs from the first as follows:

the 0 input and the output of its first multiplexer are respectively connected to the nth input conductor $3D4I_n$ of the data bus 3D4 of the second communication link L2 and to the nth input conductor $3D2I_n$ of the data bus 3D2 of the first communication link L1, the 0 input and the output of its third multiplexer are respectively connected to the nth output conductor $3D2O_n$ of the data bus 3D2 of the first communication link L1 and to the nth output conductor $3D4O_n$ of the data bus 3D4 of the second communication link L2, the 0 and 2 inputs of its second multiplexer receive the $(n-1)$th transfer signal $D(n-1)n$, its unit memory produces by way of output signal the nth transfer signal $D(n)(n+1)$, except for the eighth scanning unit for which the output signal is injected into the fourth circulation link 3DE.

It is clear that the replacement of a unidirectional scanning module such as the first scanning module 3A by a bidirectional module such as the fourth scanning module 3D does not modify in any way the shift register used to store and modify the signals carried by the communication links L1, L2.

It may be beneficial to define a bidirectional bus in the first communication link L1 when the corresponding bus in the second communication link is unidirectional. This is the case, for example, with the instruction buses 3B2, 3B4 if the program memory in which these instructions are stored is a rewritable memory, in particular a RAM. In this case the content of this memory can be modified by the test cell 3.

Figure 6:
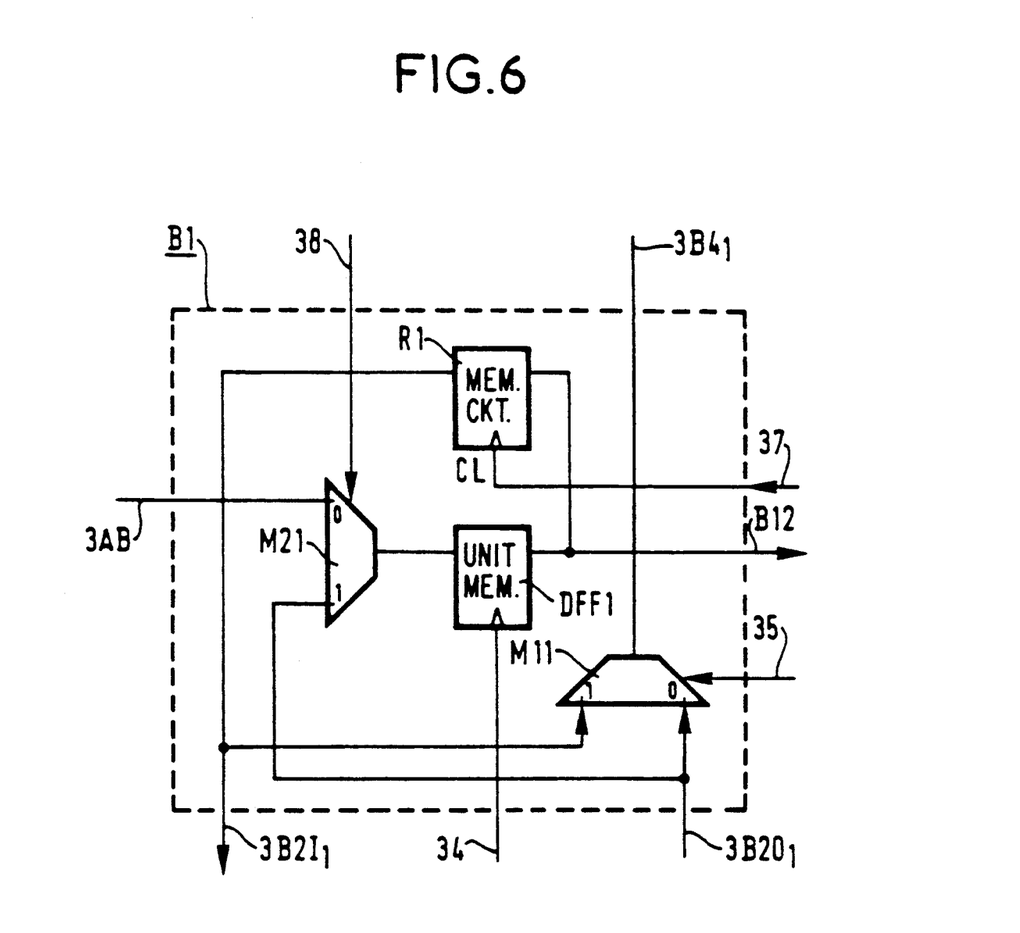
FIG. 6 shows a third embodiment of a scanning unit of a scanning module.

FIG. 6 shows one example of scanning unit for this application. This is the first scanning unit B1 of the second scanning module 3B. The instruction bus 3B4 of the second communication link L2 is unidirectional and the bus 3B2 of the first communication link L1 is bidirectional. The notation used previously is retained here. The scanning unit B1 comprises a first multiplexer M11 whose 0 input is connected to an input channel of this unit which is the first output conductor $3B2O_1$ of the instruction bus 3B2 of the first communication link, the 1 input of which is connected to the output of a memory circuit R1 identical to those previously described, the control input of which receives the first selection signal 35 and the output of which is connected to the first conductor 3B41 of the instruction bus 3B4 of the second communication link which is an output channel of this unit. It comprises a second multiplexer M21 whose 0 input is connected to the first circulation link 3AB, whose 1 input is connected to the 0 input of the first multiplexer M11, whose control input receives the second selection signal 38 and whose output is connected to the data input of a unit memory DFF1 identical to those previously described. Its unit memory DFF1 receives on its synchronization input the synchronization signal 34 and produces at its output a first transfer signal B12. Its memory circuit R1 receives the first transfer signal B12 on its data input, the trigger signal 37 on its synchronization input and its output is connected direct to the first input conductor $3B2I_1$ of the instruction bus 3B2 of the first communication link 31 which is an auxiliary channel of this unit.

The operation of the scanning unit B1 will not be described in more detail as it is readily deduced from that of the other two units previously described.

Moreover, the above remarks concerning the memory circuit R1 apply here also. Without departing from the scope of the invention, this circuit can be dispensed with provided that the 1 input of the first multiplexer M11 and the first input conductor $3B2I_1$ of the instruction 3B2 of the first communication link L1 are connected direct to the output of the unit memory DFF1.

The various connections for full implementation of the test cell 3 will not be explained here either because one skilled in the art will have no difficulty in implementing them by following the instructions given above with reference to the other types of scanning module.

There is defined in this way a test cell 3 which can store and modify the various signals carried by the communication links L1, L2 using a shift register, the information stored in this register being shifted in relation to the exchange of signals between the standard cell 4 and the application cell 2.

Note moreover that it is possible to verify that the information provided by the substitution signal 39 has not been degraded by the various scanning modules by analyzing it on the observation link 32 as it progresses through the shift register.

Figure 7:
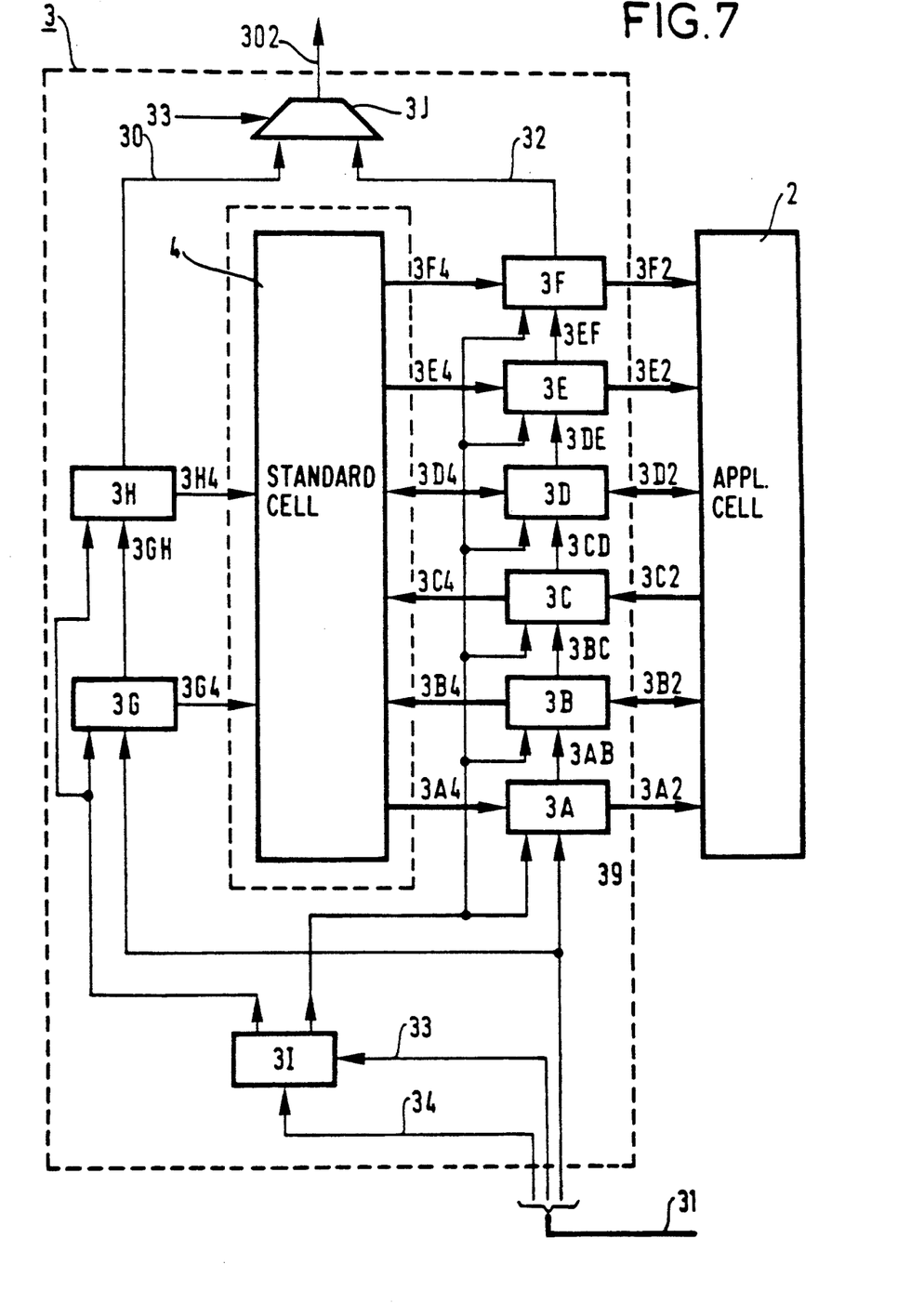
FIG. 7 is a block diagram of the integrated circuit in accordance with the invention in which the test cell has additional features.

According to a further feature of the invention, the integrated circuit 1 is also designed to modify how the standard cell 4 operates in the case of a programmable unit such as a microprocessor. This interrupt requires a break condition and a break address to be supplied to the standard cell 4, as will be explained later. The two pieces of information are produced by control registers as shown in FIG. 7.

The test cell comprises the following additional components in this case:

a break condition register 3G receiving at its input the substitution signal 39 and whose output is connected to a transmission link 3GH, a break address register 3H whose input is connected to the transmission link 3GH and whose output is connected to a supervisory link 30, a clock switch 3I which sends the synchronization signal 34 either to the various scanning modules 3A through 3F or to the two modules 3G, 3H according to whether a switching signal 33 carried by the test link 31 is in a first or a second state, respectively, an output multiplexer which produces a certification signal 302 which takes the value at its input connected to the observation link 32 or at its input connected to the supervisory link 30 according to whether the switching signal 33 is in its first or second state, respectively.

In this case, it is obviously the certification signal 302 which is connected to the exterior of the integrated circuit 1 instead of the observation link 32. When the switching signal 33 is in its first state, the test cell is equivalent to that previously described; when the switching signal 33 is in its second state, the test cell is equivalent to the set of two registers 3G, 3H.

Figure 8:
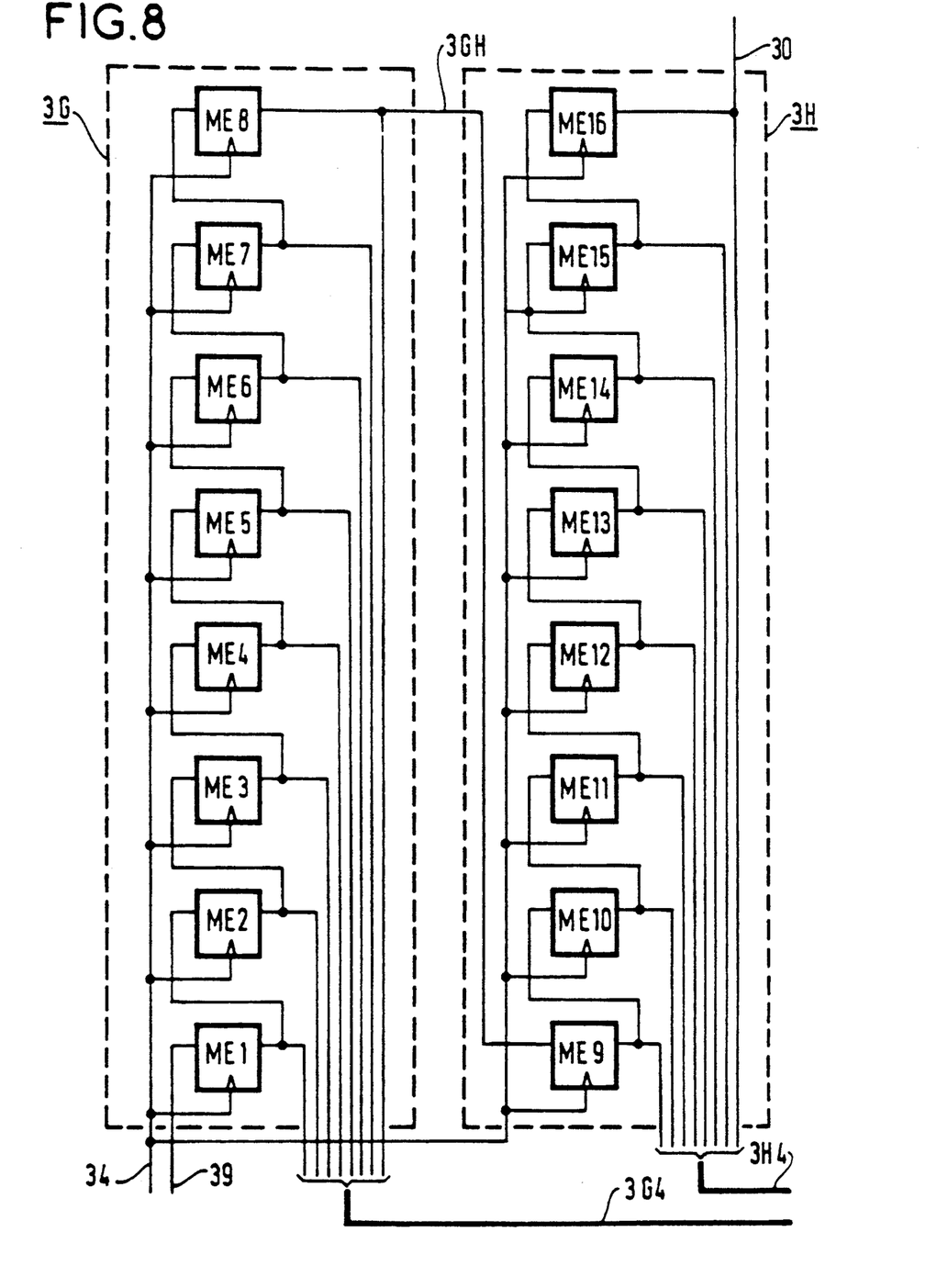
FIG. 8 is a block diagram of the registers of this test cell.

The two registers 3G, 3H are shown in a particularly simple embodiment in FIG. 8. The break condition register 3G is a set of eight unit memories ME1 through ME8 of the same type as previously described. The outputs of these memories are each connected to a conductor of a break condition bus 3G4 which is connected to the standard cell 4. The data input of the first unit memory ME1 receives the substitution signal 39 and the data input of each of the other memories is connected to the output of the previous unit memory. The synchronization inputs of these unit memories all receive a synchronization signal 34.

The structure of the break address register 3H is exactly the same as that of the previous register. The outputs of the unit memories ME9 through ME16 are each connected to one conductor of a break address bus 3H4 which is connected to the standard cell 4. The input of the first unit memory ME9 is connected to the output of the eighth unit memory ME8 of the break condition register 3G by the transmission link 3GH. The output of the eighth unit memory ME16 is connected to the supervisory link 30. The synchronization input of each unit memory receives the synchronization signal 34.

The break condition bus 3G4 and the break address bus 3H4 are control buses.

The succession of unit memories of these two registers defines a second shift register of the same type as that formed by the scanning modules. It operates in the same way, with the same control signals, and alternately with the first, according to the status of the switching signal 33. It is used to communicate information to the standard cell 4 shown in FIG. 9. Note that it is possible to verify that the information provided by the substitution signal 39 has not been degraded by these registers by analyzing it on the supervisory link 30 as it progresses through the second shift register.

Figure 9:
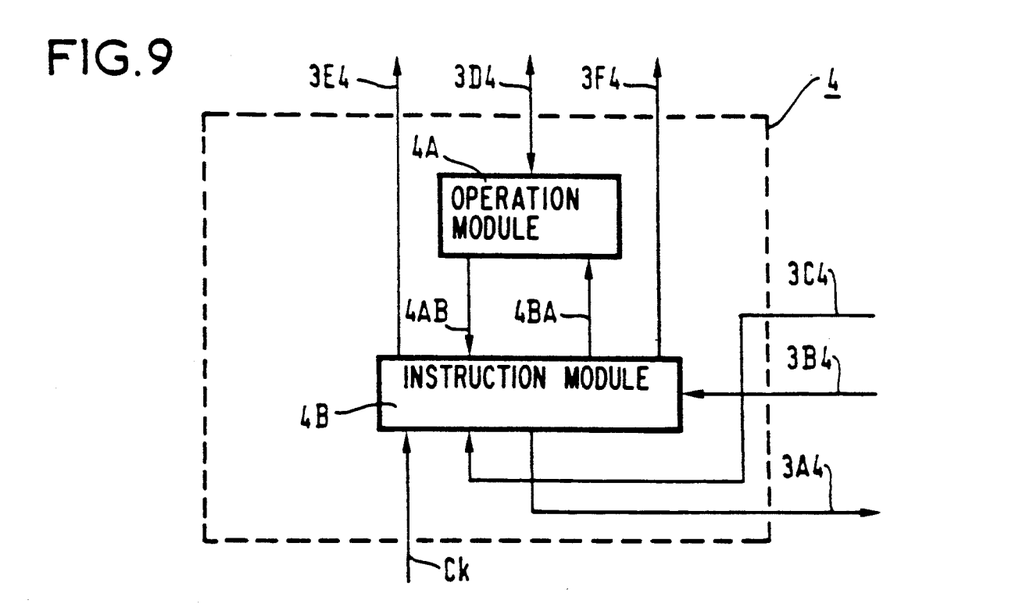
FIG. 9 is the block diagram of a known standard cell.

The standard cell 4 comprises an operation module 4A and an instruction module 4B provided with a sequencer and an instruction decoder, this being a "Harvard" type configuration.

The instruction module 4B receives over the instruction bus 3B4 an instruction from the address in the program memory that it produces on the instruction address bus 3A4. It is also connected to the control input bus 3C4. The sequencer operates synchronously with the clock signal Ck. The sequencer enables data to be exchanged between a data memory in the application cell 2 and the operation module 4A via the data bus 3D4 using the data address bus 3F4 and the data control bus 3E4. On each cycle the instruction decoder generates a control signal 4BA of the operation module which produces in return a situation signal 4AB addressed to the sequencer.

Figure 10:
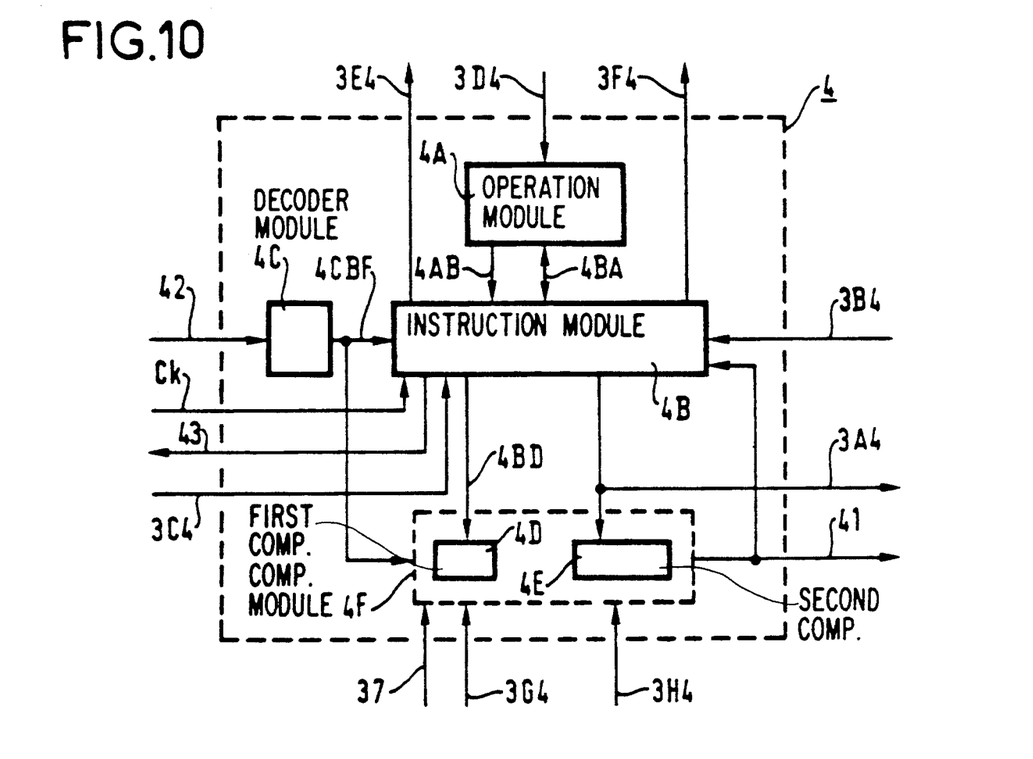
FIG. 10 is the block diagram of a standard cell modified in accordance with the invention.

The modifications made to the standard cell 4 will now be described with reference to FIG. 10. The operation module 4A of this cell is identical to the known modules in this type of device, which is one advantage of the invention.

In a manner that is also known, the instruction module 4B accesses the instruction address bus 3A4, the instruction bus 3B4, the control input bus 3C4, the control output bus 3G4 and the data address bus 3F4 and has an interrupt port for halting its operation. In the context of the invention, this module is further adapted to produce a status signal 4BD indicating the status of the sequencer and a progress status signal 43 indicating the progress of the instruction being executed. This information is particularly valuable when the instruction is executed over a plurality of sequencer cycles, which is the case, for example, with data transfers when the data is routed over the data bus in a number of stages. It is further adapted to receive an operating mode signal 4CBF defining its operation. This will be easy to do when the sequencer is specified and will not present any particular difficulty to one skilled in the art. Consequently, the operation of this module will be explained with reference to this operating mode signal 4CBF immediately after the other component parts of the standard cell 4 have been described.

The standard cell 4 comprises a decoder module 4C which receives an operation type signal 42 produced externally of the integrated circuit 1 on four wires, for example, and processes it to generate the operating mode signal 4CBF such that the latter is in a format suitable for the instruction module 4B. This decoder module is a simple interface.

The standard cell 4 also comprises a comparator module 4F which compares signals from the instruction module 4B and signals from the break condition register 3G and the break address register 3H to produce a coincidence signal 41 when these are identical, for some states of the operating mode signal 4CBF. The coincidence signal 41 is applied to the interrupt port of the instruction module 4B. In the example given here, the comparator module comprises a first comparator 4D which receives the status signal 4BD and compares it with the status of the break condition bus 3G4 and a second comparator 4E comparing the signals present on the instruction address bus 3A4 and the break address bus 3H4.

The operating mode signal 4CBF can assume various states including the following states which procure specific operation of the standard cell 4:

first state normal operation, the standard cell being equivalent to a known type cell and its operation being unmodified, second state transfer of data present on the break condition bus 3G4 and the break address bus 3H4 to the comparator module 4F, third state production of the coincidence signal 41 when the two comparators 4D, 4E have detected identical signals, fourth state production of the coincidence signal 41 under the same conditions and interruption of operation of the instruction module 4B, fifth state interruption of operation of the instruction module 4B on the instruction following the appearance of this state, sixth state step mode operation, interruption of operation of the instruction module 4B after each instruction is executed, seventh state execution of the instruction present on the instruction bus 3B4 and interruption of operation of the instruction module 4B, eighth state return to operation of the instruction module 4B following an interrupt produced by another state.

As an optional feature, the comparator module 4F does not produce the coincidence signal 41 if the trigger signal 37 is present when the operating mode signal is in one of its fourth through seventh states, the effect of which is to prevent an interrupt from the instruction module 4B.

The modifications to the standard cell described above enable the test and emulation equipment to operate on the test cell 3 according to the state of the signals to which the instruction module 4B has access, using the progress status signal 43 and the coincidence signal 41. This equipment can in particular produce the various signals carried by the test link 31 such as the three selection signals 35, 36, 38 and the trigger signal 37 in response to the coincidence signal 41. As the coincidence signal is produced at the start of execution of an instruction, the test and emulation equipment can trigger the storage of the signals present on the various buses connecting the standard cell 4 to the application cell 2 during or at the end of the instruction and interrupt the operation of the standard cell at the end of the instruction.

If the program stored in the program memory operates abnormally and does not reach a planned break point, it is therefore possible to interrupt execution of the program by producing the operating mode signal 4CBF in its fifth state. The status of the various buses and in particular that of the instruction address bus 3A4 is then accessible, which is not the case if the component is reset in the known manner.

It is also possible to store in the test cell 3 the status of all the buses connecting the standard cell 4 and the application cell 2 without modifying the operation of the instruction module 4B in response to the coincidence signal 41.

The invention naturally applies irrespective of the number of control registers and control buses, the comparator module 4F being designed accordingly.

Figure 11:
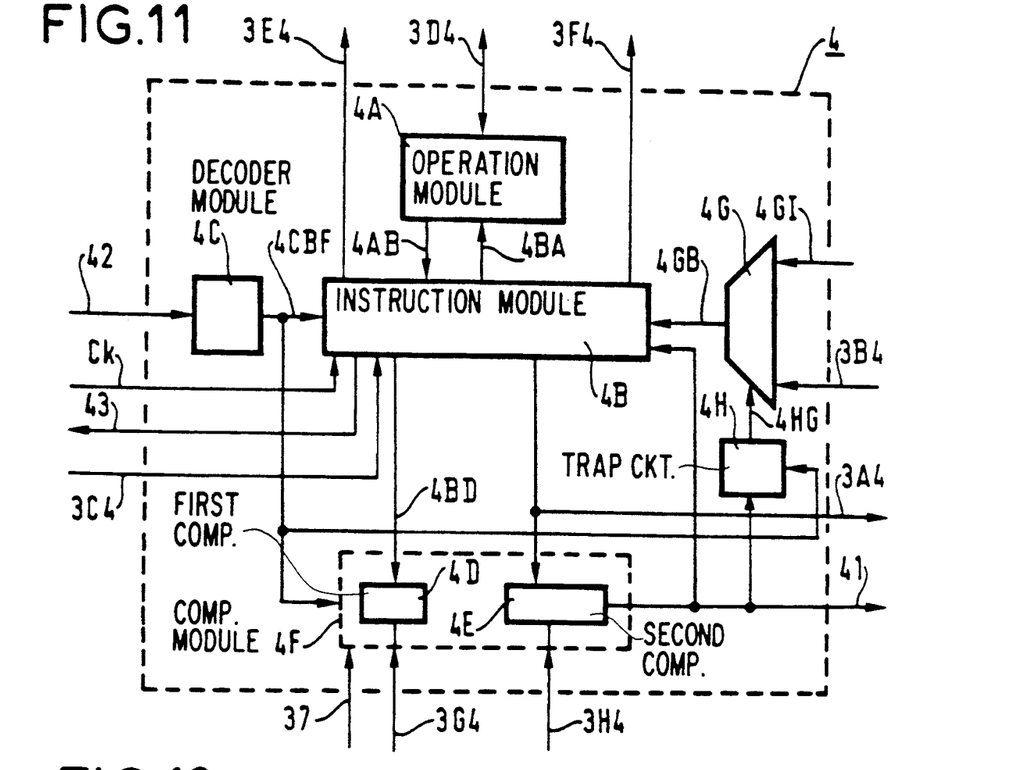
FIG. 11 is the block diagram of a variant standard cell in accordance with the invention.

The program memory of the standard cell 4 is usually a non-rewritable memory, for example a read only memory (ROM). In this case it is not possible to correct a program error. In an alternative embodiment of the integrated circuit a rewritable substitute memory (RAM, for example) is added to this memory to enable any errors to be corrected. FIG. 11 shows the substitution means which make is possible to replace a series of instructions from the program memory by a series of instructions from the substitution memory.

They comprise a trap circuit 4H which produces a trap signal 4HG for a ninth state of the operating mode signal 4CBF when the coincidence signal 41 is present. They also comprise a trap multiplexer 4G which produces on an additional instruction bus 4GB connected to the instruction module 4B in place of the instruction bus 3B4 a branch instruction 4GI if the trap signal 4HG is present and which connects the instruction bus 3B4 directly to the additional instruction bus 4GB otherwise. In the embodiment shown, which must not be regarded as limiting the invention in any way, the branch instruction 4GI is an unconditional branch instruction from a hardwired circuit.

The substitution memory (which is not shown in the figure) can in a first configuration be accessed by the instruction address bus 3A4 using a decoder circuit switching the instruction address either to the program memory or to the substitution memory, according to the address format. As the technical means will be obvious to one skilled in the art they will not be described in more detail here. Writing and reading may then be effected using the second scanning module 3B of the test cell 3. In a second configuration the substitution memory can be accessed directly by the instruction module 4B in write mode and in read mode respectively for a tenth and an eleventh state of the operating mode signal 4B. In all cases, the last instruction from this memory that can be executed is an instruction to return to the program memory.

It is clear that using means similar to those described above and the knowledge of one skilled in the art it is possible to implement a trap device capable of alleviating multiple errors in the program memory without departing from the scope of the invention.

Figure 12:
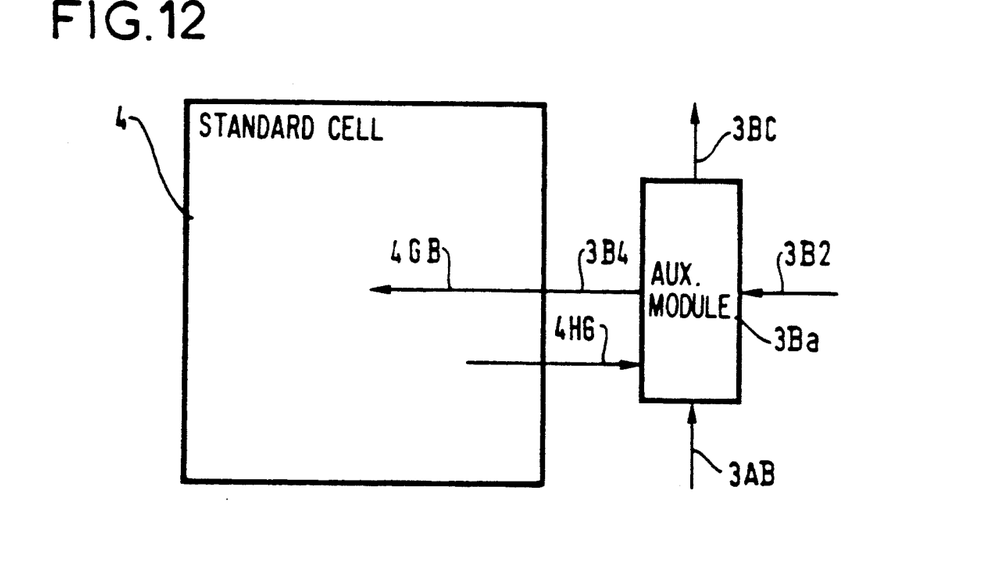
FIG. 12 shows a detail of the integrated circuit in accordance with the invention.

If the error in the program memory is restricted to a single instruction, there is a simpler way to correct the error, as shown in FIG. 12.

The second scanning module 3B is modified as follows to yield an auxiliary module 3Ba: the first multiplexer of each scanning unit B1 through B8 of this module is not controlled by the first selection signal 35 but rather by a signal which is the logical sum of the first selection signal and the trap signal 4HG produced by an OR logic operator, for example.

Also, the trap multiplexer 4G is dispensed with, the instruction bus 3B4 and the additional instruction bus 4GB being connected directly to each other.

It is therefore possible to replace an erroneous instruction with the information present at the output of the unit memories of the auxiliary scanning module 3Ba.

The invention has been described with reference to an integrated circuit comprising five unidirectional buses each of eight conductors and one bidirectional bus of 16 conductors connecting the standard cell 4 and the application cell 2. It is not limited to this particular example and if a unit link between these two cells is defined as a communication link, that is to say a conductor of a unidirectional bus or a pair of conductors of a bidirectional bus, it applies irrespective of the number of communication links and irrespective of how they are arranged. It goes without saying that the invention is also concerned with the case where the integrated circuits comprise multiple standard cells and/or multiple application cells, this latter term being understood in a very broad sense.

We claim:

1. An integrated circuit (1) for monitoring communication signals transmitted between a standard cell and an application cell, said integrated circuit comprising:
    a test cell (3), coupled between said standard cell (4) and said application cell (2) via communication links, designed to perform one of the functions of storing information supplied by said communication signals and testing said communication signals passing between said standard cell and said application cell based upon modification data supplied to said integrated circuit,
    said application cell comprising a program memory which supplies instructions, via an instruction bus, to said standard cell in response to an instruction address carried by an instruction address bus,
    said standard cell executing said instructions provided by said program memory, wherein conductors of said instruction bus and said instruction address bus are carried by said communication links, and
    wherein said standard cell comprises branching means for replacing at least one erroneous instruction from said program memory with a replacement instruction previously stored in said integrated circuit in response to an error condition detected by said test cell on at least one of said communication links.

2. The integrated circuit according to claim 1, wherein said test cell (3) comprises:
    scanning units connected to said communication links, respectively, said scanning units comprising respective unit memories coupled to said communication links, wherein said unit memories are sequentially coupled together to form a first shift register, and
    a second shift register comprising at least a first control register (3H) having outputs connected to a conductor of a first control bus (3H4), said integrated circuit further comprising a comparator module (4F) to which are respectively connected said first control bus and at least one of said communication links to produce a coincidence signal (41) when signals from said first control bus are identical with signals from said at least one of said communication links.

3. The integrated circuit according to claim 2, wherein an operating mode signal (4CBF) is supplied to said standard cell (4) and said standard cell operates in response to said operating mode signal (4CBF), and wherein said standard cell further comprises a trap circuit (4H) which produces a trap signal (4GH) for a predetermined state of said operating mode signal when said coincidence signal (41) is produced.

4. The integrated circuit according to claim 3, wherein said branching means comprises:
    a substitution memory wherein a final instruction stored therein is an instruction to return to said program memory, and
    a trap multiplexer (4G) having a first input for receiving a branch instruction to branch to said substitution memory and a second input connected to said instruction bus (3B4), wherein said first input is selected in response to said trap signal and said standard cell executes aid branch instruction supplied to said first input, and wherein said second input is selected in the absence of said trap signal so that said standard cell executes an instruction supplied to said second input.

5. The integrated circuit according to claim 4, wherein said standard cell further comprises a decoder circuit which receives said instruction address, wherein said substitution memory is accessed by said instruction address bus (3A4) by means of said decoder circuit, and wherein writing and reading operations are controlled by said scanning units of said first shift register associated with said instruction bus (3B4).

6. The integrated circuit according to claim 3, wherein said communication links of said scanning units each comprise an input channel ($3B2O_1$) and an output channel ($3B4_1$), and each of said scanning units comprise a first multiplexer (M11) having a first input connected to said input channel ($3B2O_1$), an output connected to said output channel and a control input which receives said trap signal (4HG), and a second multiplexer (M21) having a second input connected to said input channel ($3B2O_1$) and an output connected to an input of a unit memory (DFF1), wherein an output of said unit memory is connected to a second input of said first multiplexer (M11), said first shift register comprising a succession of said unit memories respectively corresponding to said scanning units, each of said unit memories being connected to the first input of the second multiplexer of a next scanning unit, output signals of said unit memories previously loaded by means of said first shift register forming said replacement instruction for replacing said erroneous instruction following the output of said trap signal.

7. The integrated circuit according to claim 6, wherein said scanning units further comprise a memory circuit (R1) having a data input connected to the output of said unit memory (DFF1) and a synchronization input which receives a trigger signal (37), and wherein the second input of said first multiplexer (M11) is connected to an output of said memory circuit.

8. The integrated circuit according to claim 4, wherein said substitution memory is accessed directly by said standard cell (4) and writing and reading operations are controlled by said operating mode signal (4CBF).

* * * * *